Dec. 16, 1969 W. A. GOTTFRIED 3,483,615
PRINTED CIRCUIT BOARDS
Filed March 28, 1966
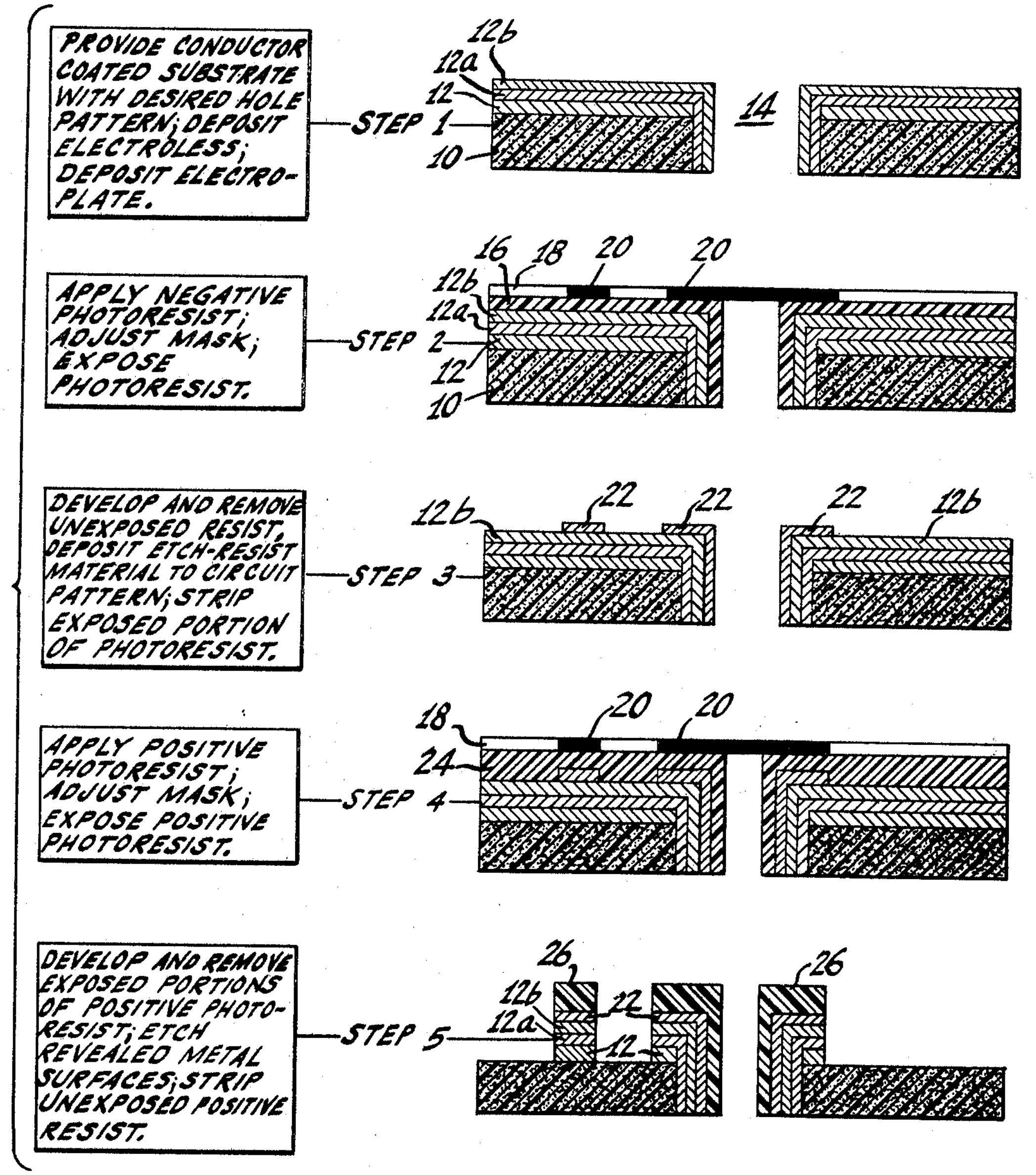
INVENTOR
WILLIAM A. GOTTFRIED
BY Edward J. Norton
ATTORNEY

United States Patent Office 3,483,615
Patented Dec. 16, 1969

3,483,615
PRINTED CIRCUIT BOARDS
William A. Gottfried, Philadelphia, Pa., assignor to RCA Corporation, a corporation of Delaware
Filed Mar. 28, 1966, Ser. No. 537,646
Int. Cl. H05k 3/00
U.S. Cl. 29—625 4 Claims

ABSTRACT OF THE DISCLOSURE

Disclosed is an improved process for making a printed circuit pattern on a board of insulating material having at least one surface clad with a conductive metal and further having a desired circuit pattern delineated on that surface by an etch resistant material wherein the steps comprise: applying a uniform coating of photoresist to the surface; placing a transparency near the surface, said transparency having an opaque pattern of the desired circuit pattern substantially in registry with the pattern formed by the etch resistant material; exposing and developing the photoresist material through the transparency to cause only the circuit pattern delineated by the etch resistant material to be covered with the unexposed photoresist; etching the uncovered conductive metal from the surface; and stripping the remaining photoresist material from the desired circuitry.

This invention relates generally to printed circuit boards, and more particularly to an improved process for making them.

Boards made of an insulating material and clad in a conductive metal, such as copper, are commonly used in the making of printed circuit boards. Once a circuit pattern is decided upon, the clad board is prepared by perforating it with one or more holes. The holes are used to make interconnections between two or more layers of circuitry provided on the board and/or are a convenient means for the mounting of components. Scraps caused by the perforation of the board and oxidation of the metal surfaces of the board are removed.

In order to make interconnections between the surface layers of metal on the board, metal must be plated into the holes. As an example of such a procedure, in the case of copper clad boards, a thin coating of electroless copper is deposited in the holes and on the surfaces of the board by first immersing the board in an electroless solution. The electroless serves as a base to hold the copper to the surface of the insulating material exposed within the holes and provides the conductive surface needed for subsequent plating. Copper is then plated to the desired thickness in the holes and on the surface of the board.

With the interconnection between surfaces of the board completed, the next step is to apply a thin, uniform coating of a negative photoresist material. Negative photoresist material has the characteristic of becoming hardened when exposed to ultraviolet light. To establish a circuit pattern in the negative photoresist material, ultraviolet light is passed through a transparency having the desired circuit pattern drawn in opaque lines. The transparency is positioned between the source of ultraviolet light and the board so that its circuit pattern coincides with the desired perforated holes.

After the board surface has been sensitized by ultraviolet light, the circuit pattern is developed. The process of developing fixes the hardened negative photoresist material and washes away the unsensitized material. The surfaces of the board are therefore covered with a negative photoresist material except where the circuit pattern is desired. Gold, solder or other etchant resistant material is then plated onto the exposed copper surfaces. The etchant resistant material protects the printed circuit pattern and holes from etching acids and prevents oxidation of the circuit surfaces. Oxidation is undesirable because it inhibits the formation of firm solder connections.

After plating, the negative photoresist material is stripped from the surfaces of the board and the now exposed, unplated copper surfaces are etched away by means of an acid. The board of insulation now has a printed circuit with plated through interconnecting holes.

This process, however, has certain undesirable effects. The plating of the etchant resistant metal must be free of pores or openings to the metal printed circuit pattern so that the etchant solution will not seep down into the printed circuit pattern. Pores and scratches in the etchant resistant metal are commonly due to either defects in the deposits of very thin layers of etchant metal material or as a result of handling. If a thick coating of etchant resistant metal is used to avoid these defects, it is more difficult to form a secure solder connection to theh printed circuit. As an example of this difficulty, a gold-solder alloy, formed when gold is in too great a quantity, will be brittle.

Therefore, it is a general object of this invention to provide an improved process for forming printed circuit patterns on insulating material.

It is another object of this invention to provide an improved printed circuit pattern that is devoid of defects and thereby more efficiently manufactured and lower in cost.

This invention concerns itself with a process of making a printed circuit pattern on a board of insulating material whose surfaces are clad with metal. Such a board is perforated with at least one hole. The board is cleaned. Metal is then plated onto the metal clad surface and into the hole. A uniform coating of negative photoresistant material is applied to at least one clad surface. A transparency having a positive opaque image of the printed circuit is placed near the clad surface. Ultraviolet light is passed through the transparency sensitizing the negative photoresist material. The negative resist material is developed exposing metal paths which form the printed circuit pattern. A thin coating of etchant resist metal is plated on the exposed metal paths and the hardened negative resist material is stripped leaving an exposed metal surface.

In accordance with the present invention, a uniform coating of positive photoresist material is now applied to the surface of the board. Ultraviolet light is again passed through the same transparency, used originally for printing the reverse image of the circuit pattern, sensitizing the positive photoresist material. The board is then developed leaving the plated printed circuit pattern covered with hardened positive photoresist material. The printed circuit is then formed by etching away the exposed metal surface and stripping the remaining positive photoresist material from the printed circuit pattern.

This invention will best be understood from the following detailed description.

A board of insulating material 10, clad in copper 12 can, when subjected to this process, be used to form a printed circuit board. The insulating material can be paper phenolic, paper epoxy, glass epoxy, or Mylar. A board of this type is generally available and has a copper surface 12 of either .0014 inch or .0028 inch thick. The former copper board is referred to as a one ounce and the latter as two ounce copper board.

Holes 14 in the board, to begin with, are drilled or punched in the board 10. The type of process employed to perforate the board depends on the material to be used. For example, glass epoxy, because of its brittleness, must be drilled. The next step is to clean the board. This step is performed mechanically and chemically. Mechanical cleaning of the board is necessary to remove burrs formed by the drilling of the holes. The burrs are removed by means of vapor blasting. The board is then cleaned by application of an abrasive such as pumice. Copper oxide which has formed on the copper surfaces can be removed by chemically cleaning the board. For example, the board can be dipped into an acid such as a solution of HCl mixed in equal parts with water. The board is then dried with filtered compressed air.

The next step is to apply a thin coating of electroless copper 12*a* to the board and to the insulating material 10 exposed within the holes 14. The electroless copper 12*a* is applied to a thickness of approximately .01 or .02 mil. The board and the inner surfaces of the holes are then plated with copper 12*b* to a thickness of approximately 1 mil.

The next step in preparing the copper clad board is to apply a uniform coating of negative photoresist material 16. Such negative photoresist material can be made of a vinyl or a polyester. It can be applied to the board by an automatic spray equipment so that it dries to a thickness of .18 mil±.05 mil.

A positive transparency 18 is employed to make a printed circuit pattern on the copper clad board. The transparency has an opaque pattern 20 which corresponds to the desired printed circuit. Ultraviolet light is passed through the transparency onto the negative photoresist material 16 on the copper clad board. The negative photoresist material 16 is hardened wherever the ultraviolet light is applied. The negative photoresist material 16 covering the circuit pattern has therefore not been subject to ultraviolet light and can be developed or washed away in a chemical bath of, for example, aromatic hydrocarbons. The effect of this bath is to fix the remaining negative photoresist material 22. A thin coat of an etchant resistant material such as gold or solder can be plated onto the exposed copper printed circuit pattern to a thickness of, for example, .05 to .1 mil. The hard negative photoresist material is now stripped from the copper clad board by means of a paint stripper, which can be for example, methylene chloride or cold trichloroethylene. The board is then cleaned either by means of a light scrubbing with pumice and a very light acid solution of HCl and water to remove copper oxide or is vapor degreased.

The next step is to coat the copper clad board with a positive photoresist 24 or other material which depolymerize under ultraviolet light such as cellulose or vinyl. A uniform coat of positive photoresist material 24 is deposited to a thickness of .18 mil±.05 mil. It is known that positive photoresist material is softened when subjected to ultraviolet light.

The identical positive transparency 18 used to form the printed circuit pattern on the copper circuit board is used again. The art work 20 on the transparency (i.e. the opaque pattern of the printed circuits) is positioned so as to be coincident with the art work printed in the prior steps. Ultraviolet light is passed through the transparency. The board is subjected to a developer which can be, for example, $\frac{3}{10}$ normal solution of sodium hydroxide. The effect of the developer is to wash away the softened positive photoresist material and to leave only the plated circuit pattern coated with hardened resist 26.

Several advantages should be noted with regard to these last two steps. First, the same positive art work pattern is used each time. This permits careful alignment of the art work so that the positive photoresist material covers the plating of gold on the circuit pattern. The hardened positive resist therefore protects the desired plated circuit pattern. Next, a circuit pattern is etched out by means of an etchant such as chromic-sulfuric acid. The hardened positive photoresist material 26 protects the plated circuit pattern. Statistically, it is highly improbable that a defect in the plating will coincide with a defect in the positive photoresist to permit the etching acid to reach the underlying pattern and cause damage. As a final step the positive photoresist material 26 is stripped from the pattern by the use of a warm caustic such as sodium carbonate or sodium hydroxide. The remaining gold or solder plate 22 is thin enough to permit a secure soldering bond to the circuit pattern and prevent the copper paths from oxidation.

What is claimed is:

1. A process for making a printed circuit pattern on a board of insulating material whose surfaces are clad with metal comprising the steps of:
   - applying a uniform coating of negative photoresist material to at least one of said metal clad surfaces of said board,
   - placing a transparency near said one clad surface of said board, the transparency having thereon an opaque pattern of said printed circuit,
   - passing light through said transparency sensitizing said negative photoresist material,
   - developing said negative photoresist material to cause said printed circuit pattern to appear on said one clad surface as exposed metal paths,
   - plating said exposed pattern with a thin coating of etchant resistant material,
   - stripping the remaining negative photoresist material leaving exposed metal surfaces unplated by said etchant resistant material,
   - applying a uniform coating of positive photoresist material to said one clad surface,
   - placing said transparency near said one clad surface of said board in the same position as when said first mentioned placement of said transparency is made,
   - passing light through said transparency sensitizing said positive photoresist material,
   - developing said positive photoresist material to cause only said printed circuit pattern plated by said etchant resistant material to be covered with said positive photoresist material,
   - etching away the exposed metal on said one surface unplated by said etchant resistant material,
   - stripping said positive photoresist material from said printed circuit pattern.

2. A process for making a printed circuit pattern on a board of insulating material whose surfaces are clad with metal comprising the steps of:
   - perforating said board with at least one hole to expose surfaces of insulation within said hole,
   - plating said surfaces of insulating within said hole with a metal to cause an electrical connection to be made between said plated surfaces within said hole and at least one of said metal clad surfaces of said board,
   - applying a uniform coating of negative photoresist material to said one clad surface,
   - placing a transparency near said one clad surface of said board, said transparency having thereon an opaque pattern of said printed circuit,
   - passing light through said transparency sensitizing said negative photoresist material,
   - developing said negative photoresist material to cause said printed circuit pattern to appear on said one clad surface as exposed metal paths at least one of which connects with said plated hole,
   - plating said exposed pattern with a thin coating of etchant resistant material,
   - stripping the remaining negative photoresist material leaving exposed metal surfaces unplated by said etchant resistant material,
   - applying a uniform coating of positive photoresist material to said one clad surface,
   - placing said transparency near said one clad surface of said board in the same position as when said first mentioned placement of said transparency is made,
   - passing light through said transparency sensitizing said positive photoresist material,
   - developing said positive photoresist material to cause only said printed circuit pattern plated by said etchant resistant material to be covered with said positive photoresist material, etching away the metal on said one surface unplated by said etchant resistant material, and stripping said positive photoresist material from said printed circuit pattern.

3. A process for making a printed circuit pattern on a board as described in claim 1 wherein:

said step of applying said coating of negative photoresist material consists of applying said negative photoresist material to a thickness of .18 mil±.05 mil, and said step of applying a coating of positive photoresist material consists of applying said positive photoresist material to a thickness of .18 mil±.05 mil.

4. A process for making a printed circuit pattern on a board of glass epoxy whose surfaces are clad with a metal comprising the steps of:

drilling at least one hole in said board to expose surface of glass epoxy within said hole, applying a thin coating of electroless copper within said hole, plating said exposed surfaces within said hole with copper to cause an electrical connection to be made between said plated surfaces within said hole and at least one of said metal clad surfaces of said board, applying a uniform coating of negative photoresist material to said one clad surface to a thickness of .18 mil±.05 mil, placing a positive transparency near said one clad surface of said board, said positive transparency having thereon an opaque pattern of said printed circuit, passing ultraviolet light through said positive transparency sensitizing said negative photoresist material, developing said negative photoresist material to cause said printed circuit pattern to appear on said one clad surface as exposed metal paths at least one of which connects with said plated hole, plating said exposed pattern with a coating of gold of a thickness of .1 mil, stripping the remaining negative photoresist material leaving exposed metal surfaces unplated by said gold, applying a uniform coating of positive photoresist material to said one clad surface to a thickness of .18 mil±.05 mil, placing said transparency near said one clad surface of said board in the same position as when said first mentioned placement of said transparency is made, passing ultraviolet light through said transparency sensitizing said positive photoresist material, emersing said board in a 3/10 normal solution of sodium hydroxide to cause only said printed circuit pattern plated by said gold to be covered with said positive photoresist material, emersing said board in a solution of chromic-sulfuric acid, and washing said board with a solution of warm sodium carbonate.

References Cited

UNITED STATES PATENTS

| | | | |
|---|---|---|---|
| 2,958,928 | 11/1960 | Bain et al. | 29—625 |
| 3,236,708 | 2/1966 | Tillis | 204—15 XR |
| 3,297,442 | 1/1967 | Spiers | 156—11 XR |
| 3,334,395 | 11/1962 | Cook et al. | 29—625 |

JOHN F. CAMPBELL, Primary Examiner

R. W. CHURCH, Assistant Examiner

U.S. Cl. X.R.

29—628; 96—362; 156—11; 174—685; 204—15